United States Patent [19]

Yamagishi

[11] Patent Number: 4,862,244
[45] Date of Patent: Aug. 29, 1989

[54] SEMICONDUCTOR DEVICE HAVING SCHOTTKY BARRIER BETWEEN METAL SILICIDE AND SILICON

[75] Inventor: Hidetaka Yamagishi, Tokyo, Japan
[73] Assignee: NEC Corporation, Tokyo, Japan
[21] Appl. No.: 228,848
[22] Filed: Aug. 3, 1988

Related U.S. Application Data

[63] Continuation of Ser. No. 716,539, Mar. 27, 1985, abandoned.

[30] Foreign Application Priority Data

Mar. 27, 1984 [JP] Japan .................................. 59-58817

[51] Int. Cl.$^4$ ..................... H01L 29/64; H01L 29/56; H01L 29/62
[52] U.S. Cl. ........................................ 357/67; 357/71; 357/15
[58] Field of Search .................. 357/15, 71, 59, 67

[56] References Cited

U.S. PATENT DOCUMENTS

| | | | |
|---|---|---|---|
| 3,668,481 | 6/1972 | Saltich et al. | 357/15 |
| 3,907,617 | 9/1975 | Zwernemann | 357/15 |
| 4,377,031 | 3/1983 | Goto et al. | 357/15 |
| 4,441,931 | 4/1984 | Levin | 357/15 |
| 4,518,981 | 5/1985 | Schlupp | 357/71 |

OTHER PUBLICATIONS

"Modified Polysilicon Emitter Process", Barson, IBM Tech. Disclosure, vol. 22, No. 9, Feb. 1980, pp. 4052-4053.

*Primary Examiner*—Rolf Hille
*Assistant Examiner*—S. V. Clark
*Attorney, Agent, or Firm*—Burns, Doane, Swecker & Mathis

[57] ABSTRACT

A semiconductor device having a Schottky barrier junction formed between a metal silicide layer and a monocrystalline silicon layer is disclosed. A polycrystalline silicon layer is formed so as to make a contact with a portion of the surface of the monocrystalline silicon layer and is further elongated over an insulation film which selectively covers the surface of the monocrystalline silicon layer. The metal silicide layer has a first portion making contact with the monocrystalline silicon layer to form the Schottky barrier junction and further has a second portion covering the polycrystalline silicon layer. The second portion of the metal silicide layer and the polycrystalline silicon layer are employed for interconnect the Schottky barrier junction to another or other circuit elements.

7 Claims, 2 Drawing Sheets

SEMICONDUCTOR DEVICE HAVING SCHOTTKY BARRIER BETWEEN METAL SILICIDE AND SILICON

This application is a continuation of application Ser. No. 716,539, Filed Mar. 27, 1985, now abandoned.

BACKGROUND OF THE INVENTION

1. Field of the Invention:

The present invention relates to a semiconductor device having a Schottky barrier, and more particularly to a semiconductor integrated circuit device having a Schottky barrier diode formed between a metal silicide layer and a silicon layer.

2. Description of the Prior Art:

A Schottky barrier diode is often connected between the base and collector of a transistor in order to suppress an excessive lowering (or rise) in the collector potential in its conductive state. The switching characteristics of the transistor are thereby improved. There are cases where a Schottky barrier junction is employed as the base-emitter junction or the base-collector junction of a transistor, or the gate junction of a junction type field-effect transistor.

A Schottky barrier used for such purposes is often constituted by a junction formed between a metal silicide layer and a silicon layer in a semiconductor integrated circuit device. The metal silicide layer is provided in such a manner that a metal is selectively deposited on a silicon layer and is then heat-treated. In an integrated circuit device, metal wiring layers are employed for interconnections between a Schottky barrier diode and a transistor, or between a transistor element having a Schottky barrier junction and another or other circuit elements. In other words, the metal wiring layer is in direct contact with the metal silicide layer. For this reason, the heat treatment which is carried out after the formation of the metal wiring layers may cause a metal contained in the metal wiring layer to diffuse into the metal silicide layer, resulting in a destruction of the Schottky barrier. Even if the destruction of the Schottky barrier does not occur, the diffusion of the metal into the metal silicide layer brings about various kinds of deterioration in electrical characteristics, such as lowering in a forward voltage, a reduction in a breakdown voltage and an increase in a leakage current.

In order to prevent the diffusion of the metal into the metal silicide layer, it has been proposed that a diffusion barrier layer made of a metal, such as chromium, titanium or vanadium, is formed between the metal silicide layer and the metal wiring layer to prevent the direct contact between them. It is, however, extremely difficult to form the diffusion barrier metal layer with a uniform film thickness. In consequence, any portion of the diffusion barrier metal layer which is thin undesirably allows the metal which constitutes the metal wiring layer to diffuse into the metal silicide layer. If the diffusion barrier layer having a large thickness is employed in order to obtain a satisfactory barrier action, then a thermal stress is applied to the metal silicide layer due to the difference in the thermal expansion coefficient between the diffusion barrier layer and the metallic silicide layer, resulting in the deterioration of the electrical characteristics. Moreover, an additional step is required for forming the diffusion barrier layer.

SUMMARY OF THE INVENTION

It is an object of the present invention to provide an improved semiconductor device having a Schottky barrier formed between a metal silicide layer and a silicon semiconductor.

It is another object of the present invention to provide a semiconductor device in which the destruction of the Schottky barrier or the deterioration in its electrical characteristics is prevented.

It is still another object of the present invention to provide a semiconductor device having a novel electrode led-out structure from a metallic silicide layer.

A semiconductor device according to the present invention comprises a single-crystal (or monocrystalline) silicon layer, a polycrystalline silicon layer making contact with a part of the single-crystal silicon layer, a metal silicide layer formed continuously from a surface portion of the single-crystal silicon layer to the surface portion of the polycrystalline silicon layer and including a first portion being in contact with the single-crystal silicon layer to form a Schottky junction and a second portion making contact with the polycrystalline silicon layer, and means for connecting the second portion of the metal silicide layer to another or other circuit elements.

The metal silicide layer has the first portion forming a Schottky junction with respect to the single-crystal silicon layer and the second portion forming an ohmic contact with the polycrystalline silicon layer and further connected to another or other circuit elements. Accordingly, the electrical connection between the Schottky junction and another or other circuit elements is effected through the second portion, so that the first portion for forming the Schottky junction is separated from a metal conductor layer to prevent the deterioration or destruction of the Schottky barrier which would otherwise be caused by the diffusion of a metal from the metal conductor layer. The polycrystalline silicon layer has the excellent adhesion to the monocrystalline silicon layer as well as the metal silicide, and their thermal expansion coefficients are close to one another. Accordingly, the metal silicide layer is not easily peeled from the polycrystalline silicon layer, and the thermal stress applied to the Schottky barrier is sufficiently suppressed.

It is favorable that the single-crystal silicon layer have a first region of one conductivity type and a second region of the opposite conductivity type formed in the first region with a PN junction and that the polycrystalline silicon layer is in contact with the second region and separated from the first region. In this case, the Schottky barrier is formed between the first region and the metal silicide layer. It is difficult to obtain a Schottky barrier between the metal silicide layer and the polycrystalline silicon layer. Rather, the ohmic contact is formed between them. Since the PN junction is present between the polycrystalline silicon layer and the first region, the short-circuiting therebetween is prevented.

BRIEF DESCRIPTION OF THE DRAWINGS

The above and other objects, features and advantages of the present invention will become more apparent from the following description taken in conjunction with the accompanying drawings, in which.

DETAILED DESCRIPTION OF THE PREFERRED EMBODIMENTS

Figure 1:
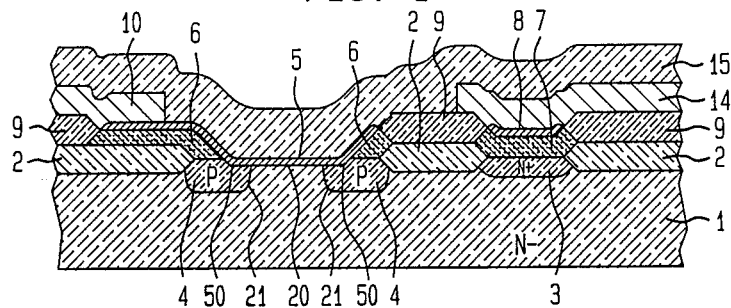
FIG. 1 is a sectional view of one embodiment of the present invention.

Referring to FIG. 1, there is shown a Schottky barrier diode according to one embodiment of the present invention. This diode is formed as one circuit element in an integrated circuit device which includes a great number of circuit elements such as transistors, resistors and diodes each formed on one semiconductor substrate. However, the circuit elements other than the Schottky barrier diode are not shown in this Figure in order to avoid complication of the drawing. The diode shown in FIG. 1 includes a single-crystal (or monocrystalline) silicon layer (or region) 1 having a relatively low impurity concentration and one conductivity type (N-type in the embodiment) and acts as a cathode region of the Schottky barrier diode. In a bipolar integrated circuit device, the layer 1 may be epitaxially formed on a silicon substrate (not shown) of the other conductivity type (that is, P type). The impurity concentration of the layer 1 is practically selected to be such a value that forms a Schottky barrier with a metal silicide. The layer 1 is selectively covered with a silicon oxide film 2 which is partially buried therein. Two portions of the layer 1 are shown in FIG. 1 and are not covered with the oxide film 2. One of them is used for leading out a cathode electrode of the Schottky barrier diode. Therefore, an N-type region 3 having a high impurity concentration is formed at this one portion.

The other of the portions of the layer 1 which are not covered with the oxide film 2 is in contact with a metal silicide (platinum silicide in this embodiment) 5, thereby forming a Schottky barrier 20 therebetween. The platinum silicide 5 is also in contact with a P-type region 4. Since the region 4 has a relatively high density, it does not constitute a Schottky barrier with the platinum silicide 5 but is in ohmic contact with the latter. The region 4 and the layer 1 form a PN junction 21, and therefore, the platinum silicide 5 does not short-circuit with the layer 1. The region 4 is also in contact with a polycrystalline silicon layer 6. The layer 6 is doped with P-type impurities, and therefore, no barrier junction is formed between the layer 6 and the region 4. The polycrystalline silicon layer 6 is formed such as to extend over the oxide film 2. The portion of the polycrystalline silicon layer 6 extending over the oxide film 2 serves as a region which is electrically connected to a metal wiring conductor layer 10. The platinum silicide layer 5 is also formed on the surface portion of the polycrystalline silicon layer 6. Since the impurity concentration of the layer 6 is relatively high, no Schottky barrier is formed between the platinum silicide layer 5 and the polycrystalline silicon layer 6. The sheet-resistance of the polycrystalline silicon layer 6 is thereby sufficiently lowered. This means that the anode lead-out resistance of the Schottky barrier diode is reduced.

The N+ region 3 is in contact with a polycrystalline silicon layer 7 which is doped with N-type impurities. On the surface portion of the layer 7 is formed a platinum silicide layer 8 which does not form any Schottky barrier therebetween. The polycrystalline silicon layers 6 and 7 are insulated from each other by a silicon oxide film 9.

A first metal wiring layer 10 made of aluminum in this embodiment is formed on a part of the platinum silicide 5, which in turn contacts with not the layer 1 but the polycrystalline silicon layer 6 which extends over the oxide film 2. A second metal wiring layer 14 of aluminum is formed on the platinum silicide layer 8. The first and second wiring layers 13 and 14 serve as anode and cathode lead-out wirings of the Schottky barrier diode, respectively, and are connected to other circuit elements (not shown). A surface protecting film 15 of silicon oxide, silicon nitride, or an organic compound like polyimide covers the device surface.

The first metal wiring layer 10 is not in direct contact with the portion of the platinum silicide layer 5 which constitutes the Schottky barrier 20 in cooperation with the layer 1. The electrical connection between the first metal wiring layer 10 and that portion of the platinum silicide layer 5 is effected by the polycrystalline silicon layer 6 and the platinum silicide layer formed thereon. Accordingly, prevented is the destruction or deterioration of the Schottky barrier 20 which would otherwise occur by the diffusion of aluminum contained in the wiring layer 10 into the Schottky barrier 20 due to the heat treatment carried out after the formation of the wiring layer 10. It should be noted that the P-type region 4 completely includes a curved portion 50 of the metal silicide layer 5 which is in contact with the single-crystal silicon layer. An ideal Schottky barrier junction is considerably higher than a PN junction in the reverse breakdown voltage. However, when a Schottky barrier junction includes a curved portion, the field concentration takes place at the curved portion to remarkably lower the reverse breakdown voltage of the Schottky barrier as compared with that of the PN junction. If the P-type region 4 were not provided, the curved portion 50 of the platinum silicide 5 would also constitute a Schottky barrier with the N-type layer 1, and the breakdown voltage of the Schottky barrier junction would be exceedingly small by the existence of the curved portion 50. The P-type region 4 prevents such deterioration in the breakdown voltage of the Schottky barrier. As a result, in the Schottky barrier diode shown in FIG. 1, the forward voltage (i.e., the threshold voltage) is determined by the Schottky junction 20, while the reverse breakdown voltage is determined by the PN junction 21, whereby the Schottky barrier diode represents extremely excellent characteristics as a circuit element in the integrated circuit device.

The diode shown in FIG. 1 may be formed by a manufacturing method which will be described hereinunder with reference to FIGS. 2 to 5.

Figure 2:
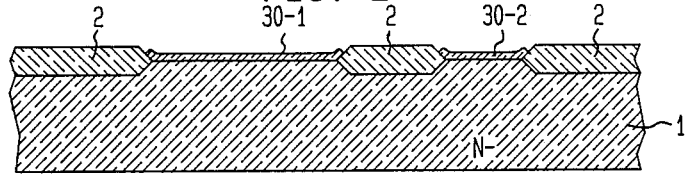
FIGS. 2 to 5 are sectional views indicating the manufacturing steps for obtaining the device structure shown in FIG. 1.

FIG. 2 shows the state in which the oxide film 2 has been formed. More specifically, oxidation resistant films 30-1 and 30-2, such as a silicon nitride film, are selectively formed on the surface of the N-type single-crystal silicon layer 1. The films 30-1 and 30-2 are formed at positions which respectively correspond to a Schottky barrier forming region and an cathode electrode lead-out region. When a silicon nitride film is selected as the films 30-1 and 30-2, it is preferable to interpose a silicon oxide film between the layer 1 and these films 30-1 and 30-2. The layer 1 has such a surface impurity density that a Schottky barrier is formed between the layer 1 and the platinum silicide layer 5. The surface impurity density required for the formation of the Schottky barrier is below $1 \times 10^{18}$ cm$^{-3}$. In this embodiment, it is designed to be $1 \times 10^{15}$ cm$^{-3}$. By employing the films 30-1 and 30-2 as a mask, the layer 1 is oxidized to form the silicon oxide film 2 having a thickness of about 1.2 μm. This technique is well-known as the selective (or local) oxidation of silicon method. One may consider that, the oxidation resistant film 30-1 is removed, platinum being formed on the layer 1 and the oxide film 2 and then heat-treated to form a platinum silicide layer which constitutes a Schottky junction in cooperation with the layer 1, and the platinum on the oxide film 2 being utilized as a lead-out electrode. The direct contact between the platinum silicide layer and a metal wiring layer connecting to another or other circuit elements may be prevented. However, platinum and a silicon oxide are greatly different from each other in the thermal expansion coefficient. For this reason, the platinum layer is undesirably separated from the oxide film. In particular, the adhesion between the platinum layer and the silicon oxide film is extremely poor, and therefore, the platinum is easily separated from the oxide film. This problem is also encountered by metals other than platinum.

Figure 3:
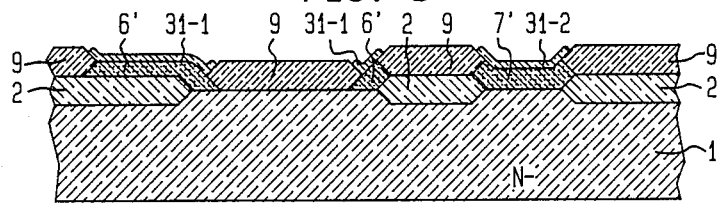

In the present invention, the oxidation resistant films 30-1 and 30-2 are removed, and a polycrystalline silicon layer containing no impurity (so-called non-doped polycrystalline silicon layer) is formed all over the surface with a thickness of about 5,000 Å. Silicon nitride films (i.e., oxidation resistant films) 31-1 and 31-2 (see FIG. 3) are selectively formed on those portions of the non-doped polycrystalline silicon layer which are intended to serve as anode and cathode lead-out electrode, respectively. The non-doped polycrystalline silicon layer is oxidized by the selective oxidation technique to form the silicon oxide film 9. The device structure in this state is shown in FIG. 3. The oxide film 9 separates and isolates the non-doped polycrystalline layers 6' and 7' from each other which are covered with the films 31-1 and 31-2 and left non-oxidized. The film 9 formed by the oxidation of the polycrystalline silicon layer have a thickness of about 1.8 μm.

Figure 4:
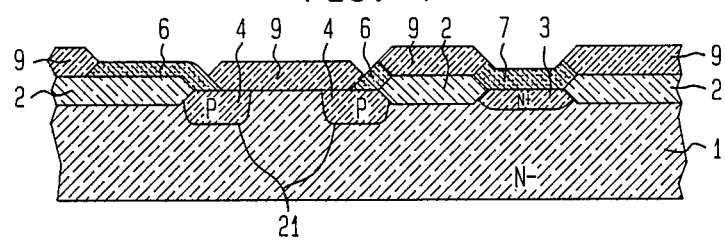

The silicon nitride films 31-1 and 31-2 employed for the selective oxidation of the polycrystalline silicon layer are thereafter removed, and the high-density regions 3 and 4 are selectively formed as shown in FIG. 4. The regions 3 and 4 are different from each other in the conductivity type. For this reason, the polycrystalline silicon layer 7' is covered at first with a proper mask such as a photoresist (not shown), and P-type impurities such as boron are introduced into the polycrystalline silicon layer 6' by the diffusion or ion-implantation, whereby the layer 6' is changed into a P-type polycrystalline silicon layer 6. The impurities introduced into the polycrystalline silicon layer 6 are further diffused into the layer 1 though the layer 6. As a result, the P-type region 4 having a surface impurity density of $5 \times 10^{18}$ cm$^{-3}$ is formed. The polycrystalline silicon layer 6 has a similar impurity density. The mask on the polycrystalline silicon layer 7' is then removed, and the impurity-containing polycrystalline silicon layer 6 is covered with a photoresist mask (not shown). N-type impurities, such as phosphorous or arsenic, are introduced into the polycrystalline silicon layer 7', whereby it is changed into an N-type polycrystalline silicon layer 7. The N-type impurities are further diffused into the layer 1, thus forming the N-type region 3 having a surface impurity density of $1 \times 10^{20}$ cm$^{-3}$.

Figure 5:
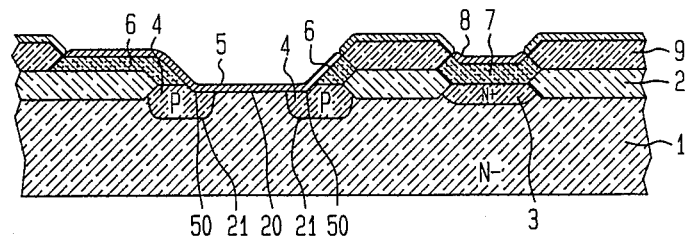

The mask on the polycrystalline silicon layer 6 is thereafter removed, and further a part of the silicon oxide film 9 is removed on the Schottky barrier forming region. Platinum is deposited all over the surface with a thickness of about 1,000 Å. Thereafter, a heat treatment is carried out to form a platinum silicide, and the contact portions of the platinum layer with the single crystal silicon (4 and 1) and the polycrystalline silicon (6 and 7) are changed into platinum silicide layers. On the other hand, no reaction takes place at the contact portion of the platinum layer with the silicon oxide film 9. As a result, as shown in FIG. 5, the platinum silicide layer 5 is continuously formed over the respective surface portions of the layer 1, the region 4 and the polycrystalline silicon layer 6, while the platinum silicide layer 8 is formed on the surface portion of the polycrystalline silicon layer 7. The Schottky barrier 20 is formed at the contact portion between the platinum silicide layer 5 and the layer 1. On the other hand, the ohmic contacts are formed at the contact portions between the platinum silicide layer 5 and the region 4 and the polycrystalline silicon layer 6 and at the contact portion between the platinum silicide layer 8 and the polycrystalline silicon layer 7. The thickness of the platinum silicide layers 5 and 8 becomes about 2,000 Å as the result of the reaction with the silicon. Accordingly, the thickness of the polycrystalline silicon layers 6 and 7 becomes about 4,000 Å.

The device is exposed to an etchant which corrodes platinum, whereby the platinum on the oxide film 9 is removed. Thereafter, aluminum as a metal wiring material is formed on the surface of the device to a thickness of about 1.2 μm by the evaporation or sputtering method. The aluminum layer is selectively removed. As a result, the first and second aluminum wiring layers 10 and 14 respectively connected to the electrodes 6 and 7 of the Schottky barrier diode and to other circuit elements are formed as shown in FIG. 1. In order to improve the ohmic contacts between the wiring layers 10 and 14 and the platinum silicide layers 5 and 8 on the polycrystalline silicon layers 6 and 7, a heat treatment is carried out at about 400° C. for 30 minutes. The surface protecting film 15 is thereafter formed.

Since the aluminum wiring layer 10 is not in direct contact with the portion of the platinum silicide layer 5 which constitutes the Schottky barrier 20, any diffusion aluminum which may be caused by the above-described heat treatment does not lead to the destruction or deterioration of the Schottky barrier 20. Further, the polycrystalline silicon layer 6 is employed to lead out the platinum layer at the Schottky barrier portion, and the layer 6 and each of the oxide films 2 and 9 are substantially equal to each other in the thermal expansion coefficient. Accordingly, there is no possibility of deterioration in the electrical characteristics of the Schottky barrier or the peeling off of the lead-out electrodes by the thermal stress.

The polycrystalline silicon layer 6 and/or 7 may be elongated to a semiconductor region or semiconductor regions of another or other circuit elements and directly connected to that region or regions. In this case, the aluminum wiring layer 10 and/or 14 is unnecessary.

Figure 6:
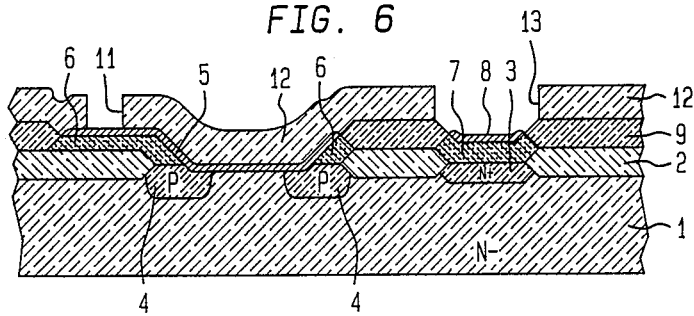
FIGS. 6 and 7 are sectional views showing another embodiment of the present invention.
Figure 7:
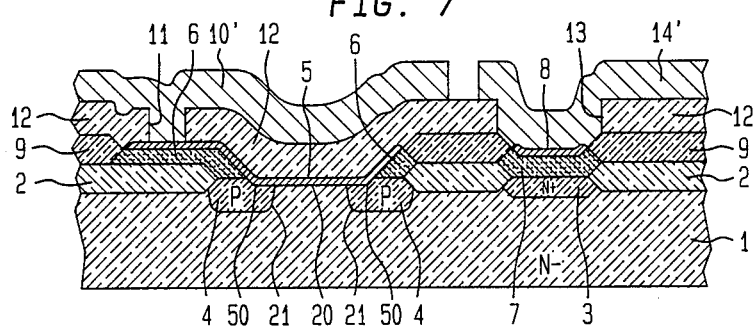

A multi-layer wiring structure is often employed in an integrated circuit device to enhance the wiring density. In this case, after the platinum (see FIG. 5) on the oxide film 9 is removed, a silicon oxide film 12 having a thickness of about 1 μm is formed, as shown in FIG. 6, on the surface of the device by the CVD (chemical vapor deposition) technique, as an insulation film between the multi-layer wirings. The oxide film 12 is selectively removed to form contact holes 11 and 13. The contact hole 11 is located on the potion of the layer 6 which extends over the oxide film 2, and the contact hole 13 is located above the electrode 7. Aluminum is thereafter formed on all the surface so as to fill the contact holes 11 and 13. By the selective etching, the wiring layers 10' and 14' are formed as shown in FIG. 7 to perform the interconnection between the Schottky barrier diode and other circuit elements. In the multilayer wiring structure, the polycrystalline layers 6 and 7 are formed simultaneously with the formation of a first-level wiring layer made of polycrystalline silicon. Therefore, there is no increase in the number of manufacturing steps. The aluminum wirings 10' and 14' may be employed as the second-level wiring conductor layer. It is noted that in FIG. 7 the aluminum wiring layer 10' is elongated on the portion of the insulating film 12 which covers the silicide layer 5 forming the Schottky barrier 20. This means that the contamination from the atmosphere to the Schottky barrier 20 is prevented, and therefore, the protecting film 15 in FIG. 1 may be omitted.

As has been described above, the feature of the present invention is in that the metal silicide layer for forming a Schottky barrier is led-out to another or other circuit elements by the polycrystalline silicon layer. Accordingly, the present invention is not limited to the above-described embodiments but may be changable and modifiable without departing from the scope and spirit of the invention. For example, it is possible to form polycrystalline silicon layers 6 and 7 which have previously been doped with impurities. Further, the polycrystalline silicon layers 7 and 6 may be formed after the formation of the regions 3 and 4.

What is claimed is:

1. A semiconductor device comprising:
a monocrystalline silicon layer of an N-type conductivity having a main surface;
a silicon oxide film selectively covering said main surface;
a first aperture formed in said silicon oxide film and exposing a first surface portion of said main surface, said first surface portion having a central portion and a peripheral portion surrounding said central portion;
a second aperture formed in said silicon oxide film and exposing a second surface portion of said main surface;
first and second polycrystalline silicon layers, said first polycrystalline silicon layer being formed in contact with said peripheral portion of said first surface portion through said first aperture, said first polycrystalline silicon layer being extended over said silicon oxide film to form an extended portion lying on said silicon oxide film, said first polycrystalline silicon layer being highly doped with impurities of a P-type conductivity, said second polycrystalline silicon layer being in contact with the entire area of said second surface portion and being highly doped with impurities of said N-type conductivity;
a first region of said P-type conductivity formed in said monocrystalline silicon layer at said peripheral portion of said first surface portion, said first region being in contact with said first polycrystalline silicon layer and including impurities of said P-type conductivity derived from said first polycrystalline silicon layer;
a second region of said N-type conductivity formed in said monocrystalline silicon layer at second surface portion, said second region being in contact with said second polycrystalline silicon layer and having an impurity concentration higher than that of said monocrystalline silicon layer;
a first metal silicide layer formed continuously on said central portion of said first surface portion and on a surface of said first polycrystalline silicon layer, said first metal silicide layer constituting a Schottky barrier with said monocrystalline silicon layer at said central portion of said first surface portion and an ohmic contact with said first polycrystalline silicon layer;
a second metal silicide layer formed on a surface of said second polycrystalline silicon layer and constituting an ohmic contact therewith;
a first electrode provided on a part of said first metal silicide layer, said part of said first metal silicide layer being formed on said extended portion of said first polycrystalline silicon layer, said first electrode being remote from another part of said first metal silicide layer, said other part of said first metal silicide layer being formed on said central portion of said first surface portion;
an insulating film formed on said other part of said first metal silicide layer; and
a second electrode provided on said second metal silicide layer.

2. The semiconductor device as claimed in claim 1, wherein each of said first and second metal silicide layers is made of platinum silicide and each of said first and second electrodes is made of aluminum.

3. A semiconductor device comprising:
an N-type layer having a first impurity concentration;
a P-type region selectively formed in said N-type layer;
an N-type region selectively formed in said N-type layer and having a second impurity concentration higher than said first impurity concentration;
an insulating film formed on surfaces of said N-type layer, said P-type region and said N-type region;
a first aperture formed in said insulating film, said first aperture exposing a part of a PN junction formed between said N-type layer and said P-type region to thereby expose both of a part of the surface of said N-type layer and a part of the surface of said P-type region;
a second aperture formed in said insulating film and exposing a part of the surface of said N-type region;
a P-type polycrystalline silicon layer formed in contact with said part of the surface of said P-type region through said first aperture and extended over one portion of said insulating film to form an extended portion, said P-type polycrystalline silicon layer being free of contact with said N-type layer, said P-type region containing the same impurity as the impurity of said P-type polycrystalline silicon layer;
an N-type polycrystalline silicon layer formed in contact with said N-type region through said second aperture and extended over another portion of said insulating film;
an oxidation film of polycrystalline silicon formed on said insulating film and intervening between said P-type and N-type polycrystalline silicon layers to isolate therebetween;
a first platinum silicide layer provided continuously on said part of the surface of said N-type layer and on a surface of said P-type polycrystalline silicon layer, said first platinum silicide layer forming a Schottky barrier with said N-type layer and an ohmic contact with said P-type polycrystalline silicon layer;

a second platinum silicide layer provided on a surface of said N-type polycrystalline silicon layer, said second platinum silicide layer forming an ohmic contact therewith;

a first electrode formed on one portion of said first platinum silicide layer, said one portion of said first platinum silicide layer being provided on said extended portion of said P-type polycrystalline silicon layer, said first electrode being free of contact with another portion of said first platinum silicide layer, said other portion of said first platinum silicide layer forming said Schottky barrier;

an insulating film formed on said other portion of said platinum silicide layer; and a second electrode formed on said second platinum silicide layer and extended over said oxidation film of polycrystalline silicon.

4. The semiconductor device as claimed in claim 3, wherein said insulating film is made of a silicon oxide film formed by selectively oxidizing said N-type layer.

5. A semiconductor device comprising:
a first region of one conductivity type;
a second region of an opposite conductivity type formed in said first region;
a first insulating film formed on surfaces of said first and second regions;
a first aperture formed in said first insulating film, said first aperture exposing a part of a PN junction formed between said first and second regions to thereby expose both of a part of the surface of said first region and a part of the surface of said second region;
a polycrystalline layer formed in contact with said part of the surface of said second region through said first aperture and extended over said first insulating film to form an extended portion, said polycrystalline layer being doped with impurities of said opposite conductivity type at a high concentration and being free of contact with said first region;
a metal silicide layer formed continuously on said part of the surface of said first region and on a surface of said polycrystalline layer, said metal silicide layer constituting a Schottky barrier with said first region and an ohmic contact with said polycrystalline layer;
a second insulating film covering a surface of said metal silicide layer;
a second aperture formed in said second insulating film to expose a part of said metal silicide layer, said part of said metal silicide layer being formed on said extended portion of said polycrystalline layer and being remote from said part of the surface of said first region; and
a metal electrode connected to said part of said metal silicide layer through said second aperture and elongated over said second insulating film to cover, via said second insulating film, another part of said metal silicide layer, said other part of said metal silicide layer constituting said Schottky barrier.

6. The semiconductor device as claimed in claim 5, wherein said one conductivity type is an N-type and said opposite conductivity type is a P-type.

7. A semiconductor device comprising:
a monocrystalline layer of an N-type conductivity having a main surface;
an oxide film selectively covering said main surface;
a first aperture formed in said oxide film and exposing a first surface portion of said main surface, said first surface portion having a central portion and a peripheral portion surrounding said central portion;
a second aperture formed in said oxide film and exposing a second surface portion of said main surface;
first and second polycrystalline layers, said first polycrystalline layer being formed in contact with said peripheral portion of said first surface portion through said first aperture and extended over said oxide film to form an extended portion, said first polycrystalline layer being highly doped with impurities of a P-type conductivity, said second polycrystalline layer being formed in contact with the entire area of said second surface portion through said second aperture and doped highly with impurities of said N-type conductivity;
a first region of said P-type conductivity formed in said monocrystalline layer at said peripheral portion of said first surface portion, said first region being in contact with said first polycrystalline layer and including impurities of said P-type conductivity derived from said first polycrystalline layer;
a second region of said N-type conductivity formed in said monocrystalline layer at said second surface portion, said second region being in contact with said second polycrystalline layer and having an impurity concentration higher than that of said monocrystalline layer;
a first platinum silicide layer provided continuously on said central portion of said first surface portion and on a surface of said first polycrystalline layer, said first platinum silicide layer forming a Schottky barrier with said monocrystalline layer and an ohmic contact with said first polycrystalline layer;
a second platinum silicide layer provided on said second polycrystalline layer and forming an ohmic contact therewith;
an insulating film covering surfaces of said first and second platinum silicide layers;
a third aperture formed in said insulating film to expose one portion of said first platinum silicide layer, said one portion of said first platinum silicide layer being provided on said extended portion of said first polycrystalline layer and being remote from said central portion of said first surface portion;
a fourth aperture formed in said insulating film to expose said second platinum silicide layer;
an anode electrode formed in contact with said one portion of said first platinum silicide layer through said third aperture and extended on said insulating film to cover, via said insulating film, another portion of said first platinum silicide layer, said other portion of said first platinum silicide layer forming said Schottky barrier; and
a cathode electrode formed in contact with said second platinum silicide layer through said fourth aperture.

* * * * *